United States Patent [19]

Hayashi

[11] Patent Number: 4,760,231
[45] Date of Patent: Jul. 26, 1988

[54] NOISE FILTER FOR ELECTRIC APPARATUS

[75] Inventor: Kunihiro Hayashi, Nara, Japan

[73] Assignee: Sharp Kabushiki Kaisha, Osaka, Japan

[21] Appl. No.: 778,082

[22] Filed: Sep. 20, 1985

[30] Foreign Application Priority Data

Sep. 21, 1984 [JP] Japan .................................. 59-198947

[51] Int. Cl.[4] .............................................. H05B 6/06
[52] U.S. Cl. .................................... 219/10.77; 363/47; 333/175; 219/10.75
[58] Field of Search .......................... 219/10.77, 10.75; 363/47, 48; 333/181, 175, 167; 455/307

[56] References Cited

U.S. PATENT DOCUMENTS 2,035,457  3/1936  Blumlein .......................... 333/181 X
3,237,080  2/1966  Pudewill .......................... 333/181 X
3,374,425  3/1968  Barditch et al. .................. 363/47 X
4,228,492 10/1980  Hausler et al. ....................... 363/48
4,308,575 12/1981  Mase ..................................... 363/48
4,578,553  3/1986  Yamashita et al. ........... 219/10.75 X

OTHER PUBLICATIONS

Siemens 1977/78 Data Book, Rf Suppression Components, pp. 262-263, 275.
*Electronics*, Oct. 1966, pp. 58-67.

*Primary Examiner*—Philip H. Leung
*Attorney, Agent, or Firm*—Birch, Stewart, Kolasch & Birch

[57] ABSTRACT

A noise filter connected to power lines includes two coils connected to the power lines in series, respectively, two capacitances connected to one end of the coils, respectively, and at least one resistance for reducing the gain of a resonance frequency of the filter the resistance being connected to the capacitances and grounded.

5 Claims, 2 Drawing Sheets

NOISE FILTER FOR ELECTRIC APPARATUS

BACKGROUND OF THE INVENTION

The present invention relates to a noise filter and, more particularly, to a noise filter for an electric apparatus such as an induction heating apparatus which prevents noise produced from the electric apparatus from leaking to the outside via a power line.

Noise produced from an electric apparatus leaks out through a power line connected to the electric apparatus. To solve this problem, a noise filter is generally used and inserted into the power line of an electric apparatus for enabling the prevention of noise leakage to the outside. However, a part of the noise filter of a related art of the present invention tends to form a resonance circuit. Therefore, when the resonance circuit is excited at a resonance frequency, the noise from the electric apparatus may leak out to the outside through the power line. Accordingly, it is desired that a novel noise filter be provided to prevent the noise produced from the electric apparatus from leaking to the outside through the power line by restricting an internal resonance phenomenon.

SUMMARY OF THE INVENTION

Accordingly, it is an object of the present invention to provide an improved noise filter which prevents noise produced from an electric apparatus from leaking out to the outside through a power line by limiting the occurrence of an internal resonance phenomenon.

It is another object of the present invention to provide an improved noise filter for an electric apparatus which reduce noise that influences other electric apparatus.

It is still another object of the present invention to provide an improved noise filter for an electric apparatus which prevents noise which may block a radio frequency wave from leaking out.

It is a further object of the present invention to provide an improved noise filter for an electric apparatus which can reduce a self-resonance operation by inserting resistance means.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

To achieve the above objects, according to an embodidment of the present invention, a noise filter connected to power line means comprises coil means connected in series to said power line means, capacitance means connected to one end of said coil means, and resistance means for controlling a resonance phenomenon, one end of the said resistance means being connected to one end of said capacitance means, the other end of the resistance means being grounded.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE EMBODIMENTS

Figure 1:
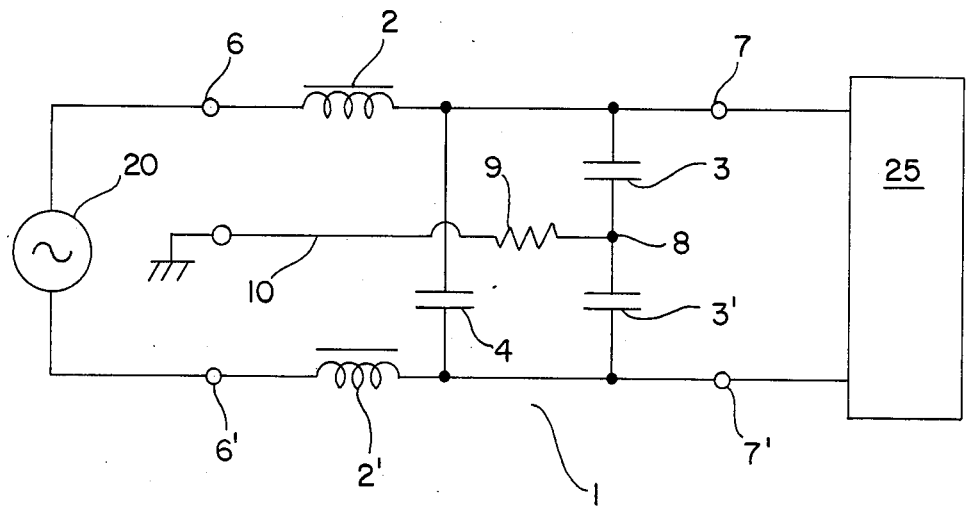
FIG. 1 shows a circuit diagram of a noise filter according to an embodiment of the present invention.

FIG. 1 shows a circuit diagram of a noise filter according to an embodiment of the present invention. A noise filter 1 of the present invention comprises choke coils 2 and 2', line bypass capacitances 3 and 3', a line-across capacitance 4, and a resistance 9.

An alternating current (AC) power source 20 is connected to input terminals 6 and 6'. A main part 25 of an electric apparatus is connected to output terminals 7 and 7' for the power source 20. The noise filter 1 is inserted into and connected between the AC power 20 and the main part 25 of the electric apparatus for preventing noise from the electric apparatus from leaking out to the AC power source 20 through power lines connecting the elements 6-7 and 6'-7'.

If the electric apparatus is an induction heating apparatus, the main part 25 is an inverter.

The choke coils 2 and 2' are connected between the input terminals 6 and 6' for the AC power source 20 and the output terminals 7 and 7' for the power source 20, respectively, or in other words, inserted into the power lines connecting the elements 6-7 and 6'-7' in series, respectively.

The line-across capacitance 4 is connected between the power lines connecting the elements 6-7 and 6'-7'. One end of the line across capacitance 4 is conected between one end of the choke coil 2 and the output terminals 7, and the other end of the line-across capacitance 4 is connected between one end of the choke coil 2' and the output terminal 7'.

One end of the line bypass capacitances 3 and 3' are connected to the sides of the output terminals 7 and 7', respectively, or in other words, connected between one end of the choke coils 2 and 2' and the output terminals 7 and 7', respectively, and the other ends of the line bypass capacitances 3 and 3' are connected to each other.

The resistance 9 is connected to the connection point 8 between the line bypass capacitances 3 and 3', and further is grounded through the grounded line 10.

The components 2, 2', 3, 3', 4, and 9 are packaged on a printed circuit substrate to form the noise filter of the present invention.

The operation of the noise filter 1 will be described below. Normal mode noise produced from the main part 25 of the electric apparatus connected between the output terminals 7 and 7' is entered into the noise filter 1 through the output terminals 7 and 7'. Because a metal casing or a metal portion of the electric apparatus is grounded for safety, a floating capacitance between the main part 25 of the electric apparatus and the metal casing or metal portion is produced, so that common mode noise is produced at both ends of the line bypass capacitances 3 and 3'.

The choke coils 2 and 2' and the line-across capacitance 4 prevent the normal mode noise from leaking out to the AC power side through the power lines connecting the elements 6-7 and 6'-7', and the line bypass capacitances 3 and 3' prevent the common mode noise from leaking out to the AC power side through the power lines of the elements 6-7 and 6'-7'.

If an inductance of each of the choke coils 2 and 2' is set about 30 μH and the value of each of the line bypass capacitances 3 and 3' is set about 1000 pF, the resonance phenomenon having about 900 KHz frequency may occur. In the present invention, this resonance is reduced by the resistance 9, so that the unnecessary resonance is controlled and reduced without the generation of noise.

Since a tank circuit comprises the choke coil 2 and the line bypass capacitance 3 at the resonance frequency of about 900 KHz, the resonance operation is carried out, and further, the main circuit of the main part 25 and the tank circuit are connected to each other with the floating capacitance so that a gain may be produced by the resonance frequency. However, according to the present invention, because the resistance 9 is provided with the noise filter, the gain produced by the resonance frequency can be reduced by the resistance 9.

Figure 3A:
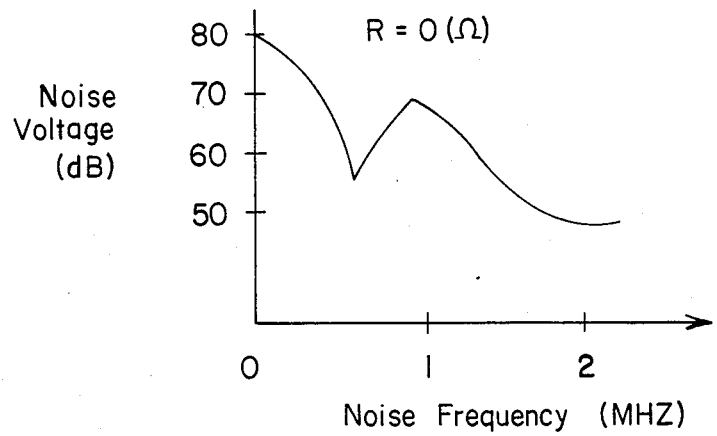
FIGS. 3(1), 3(2), and 3(3) show relationships between a noise voltage and a noise frequency when the values of the resistance are about 0 ohm, about 47 ohm, and about 100 ohm, respectively.
Figure 3B:
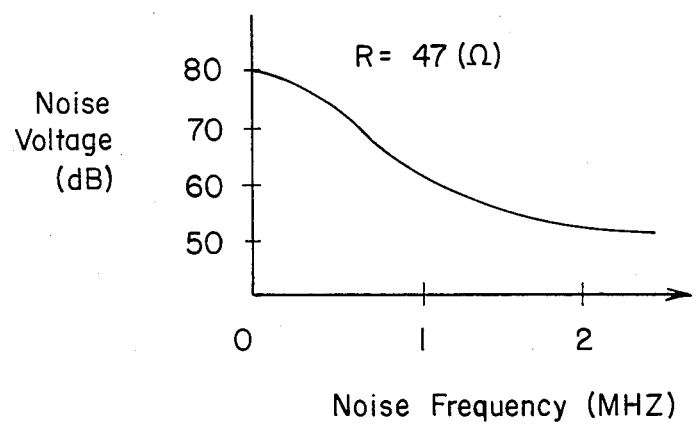
Figure 3C:
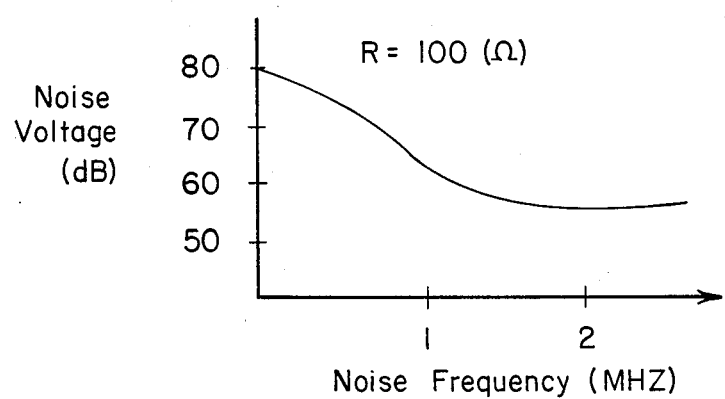

In the relationship between a noise voltage and a noise frequency, when the noise frequency becomes high as shown in FIGS. 3(1), 3(2), and 3(3), the resistance 9 is connected to the impedance of the line bypass capacitance 3 in series so that a bypass function is decreased. Accordingly, the value R of the resistance 9 may be, preferably, half through twice the impedance $R_L$ between the power lines of elements 6-7 and 6'-7' and the grounded line ($\frac{1}{2}R_L \leq R \leq 2R_L$).

FIG. 3(1) shows a relationship between a noise voltage and a noise frequency produced between the power line and the grounded line when the value R of the resistance 9 is about 0 ohm. In FIGS. 3(2) and 3(3), the values R are about 47 ohms and about 100 ohms, respectively.

Figure 2:
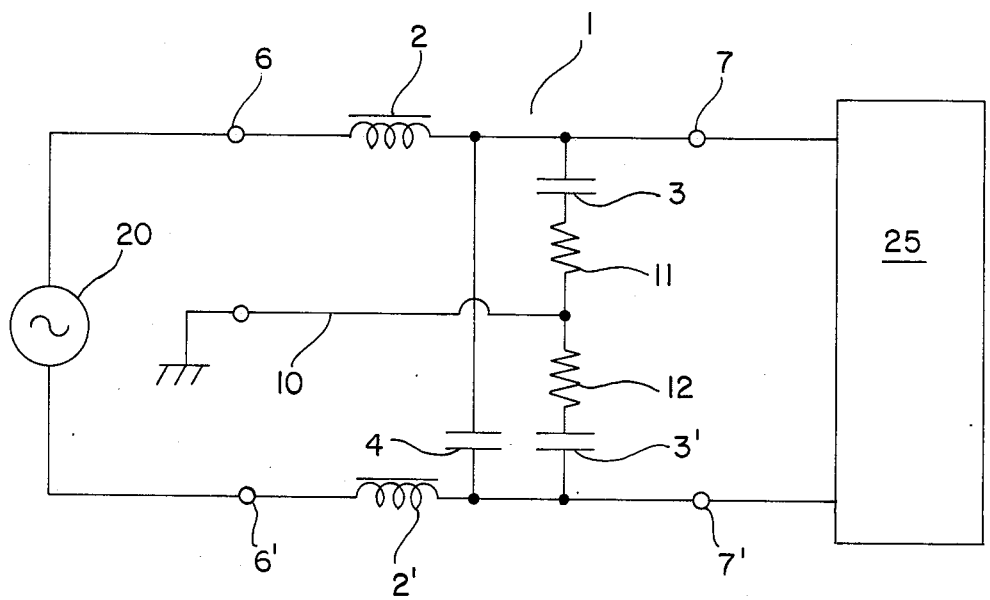
FIG. 2 shows a circuit diagram of a noise filter according to another embodiment of the present invention.

FIG. 2 shows a circuit diagram of a noise filter of another embodiment of the present invention. One end of resistance 11 and 12 are connected to the line bypass capacitances 3 and 3' in series, respectively. The other ends of the resistances 11 and 12 are connected to each other and are grounded through the grounded line 10.

Because the unnecessary resonance is controlled by the noise filter of the present invention connected to the power lines, noise which may block a radio frequency wave is not leaked out to the outside through the power lines.

The noise filter prevents the leakage of the noise such as switching noise from the main part of the apparatus to the outside through the power lines.

In FIG. 1, if the resistance 9 were absent in the noise filter, the choke coils 2 and 2', the capacitances 3 and 3', the grounded line 10 and one of the power lines of the elements 6-7 and 6'-7' would form a resonance circuit. Therefore, the circuit of FIG. 1 without the resistance 9 could not be operated as a noise filter at a resonance frequency, and further would permit the leakage of noise through the power lines.

When the value of each of the capacitances 3 and 3' is set about 1000 pF and the inductance of each of the choke coils 2 and 2' is set about 30 μH, the resonance is excited on a middle band frequency area, so that the resonance frequency becomes about 900 KHz. Accordingly, radio blocking on a middle frequency radio wave could be possible by the resonance phenomenon. In the present invention, because the noise filter includes the resistance 9, the above problem can be solved.

The electric apparatus must be adapted to noise terminal voltage standard such as FCC, VDE, and CISPR. Therefore, the noise filter including impedance elements such as a coil and a capacitance is inserted into and connected to the power line to prevent noise from the electric apparatus from leaking out to the outside through the power line. The frequency in the standard is ranged in a wide-band frequency area, for example, between about 10 KHz and about 30 MHz. In the range of the wide-band area, the noise leakage to the outside is not suppressed by the resonance frequency of the resonance circuit including the coil and the capacitance of the noise filter and the gain may be obtained. In the present invention, the resistance is provided with the noise filter, to therefore enable the control of the self-resonance. The noise level can decrease by about 10 dB at the resonance point. On the contrary, although the impedance of the noise filter by the insertion of the resistance may be increased and the effect of the control of noise at a high frequency may be decreased, this problem does not influence the operation of the electric apparatus and can be ignored.

The invention being thus described, it will be obvious that the same may be varied in many ways. Such variations are not to be regarded as a departure from the spirit and scope of the invention, and all such modifications are intended to be included within the scope of the following claims.

What is claimed is:

1. An induction heating apparatus including an induction heater comprising:
    inverter means including input terminals, for providing a supply of power for the operation of said apparatus; and
    a noise filter having a specific gain at a resonance frequency thereof, connected between a source of power and said input terminals, for preventing noise components from the induction apparatus from escaping, the noise filter comprising,
    input means connected to said source of power,
    output means connected to said input terminals,
    inductance means connected in series between said input means and output means,
    capacitance means having one end connected to said inductance means, and
    resistance means having one end connected to another end of said capacitance means, the other end of said resistance means connected to ground, for reducing the gain at said resonance frequency of said filter.

2. A noise filter having a specific gain at a resonance frequency thereof, comprising:
    input means connected to a power source;
    output means connected to an electrical apparatus to be driven by said source;
    inductance means connected in series between said input means and said output means;
    capacitance means having one end connected to said inductance means; and
    resistance means having one end connected to another end of said capacitance means, the other end of said resistance means being connected to ground, for reducing the gain at said resonance frequency of said filter.

3. The noise filter of claim 2, wherein:

said input and output means each comprise a pair of terminals, said inductance means comprises a pair of inductance coils each respectively connected between one input terminal and one output terminal, said capacitance means comprises two capacitances each respectively connected to one end of a respective inductance coil, said capacitances also connected to each other, and said resistance means comprises a resistance connected at one end to a junction between said two capacitances, and at another end to ground.

4. The noise filter of claim 2, wherein the resistance means is provided for reducing a resonance of the inductance means and the capacitance means.

5. A noise filter having a specific gain at a resonance frequency thereof, comprising:
  input means connected to a power source;
  output means connected to an electrical apparatus to be driven by said source;
  inductance means connected in series between said input means and said output means;
  capacitance means having one end connected to said inductance means; and
  resistance means having one end connected to another end of said capacitance means, the other end of said resistance means being connected to ground, for reducing the gain at said resonance frequency of said filter;
  said input and output means each comprising a pair of terminals,
  said inductance means comprising a pair of inductance coils each respectively connected between one input terminal and one output terminal,
  said capacitance means comprising two capacitances each respectively connected to one end of a respective inductance coil, and
  said resistance means comprising two resistances connected in series between said two capacitances, the junction of said two resistances connected to ground.

* * * * *